United States Patent
Julien et al.

(10) Patent No.: US 11,817,484 B2
(45) Date of Patent: *Nov. 14, 2023

(54) METHOD FOR MANUFACTURING AN ELECTRONIC DEVICE

(71) Applicants: STMICROELECTRONICS (CROLLES 2) SAS, Crolles (FR); STMICROELECTRONICS (ROUSSET) SAS, Rousset (FR)

(72) Inventors: Franck Julien, La Penne sur Huveaune (FR); Stephan Niel, Meylan (FR); Leo Gave, Montpellier (FR)

(73) Assignees: STMICROELECTRONICS (CROLLES 2) SAS, Crolles (FR); STMICROELECTRONICS (ROUSSET) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/935,754

(22) Filed: Sep. 27, 2022

(65) Prior Publication Data

US 2023/0012522 A1      Jan. 19, 2023

Related U.S. Application Data

(63) Continuation of application No. 17/100,559, filed on Nov. 20, 2020, now Pat. No. 11,522,057.

(30) Foreign Application Priority Data

Nov. 22, 2019   (FR) ...................... 1913092

(51) Int. Cl.
*H01L 29/40*      (2006.01)
*H01L 29/51*      (2006.01)
*H01L 29/66*      (2006.01)

(52) U.S. Cl.
CPC .......... *H01L 29/401* (2013.01); *H01L 29/518* (2013.01); *H01L 29/6634* (2013.01)

(58) Field of Classification Search
CPC . H01L 29/401; H01L 29/518; H01L 29/6634; H01L 21/76224;
(Continued)

(56) References Cited

U.S. PATENT DOCUMENTS

| 4,652,334 A | 3/1987 | Jain et al. |
| 6,002,160 A | 12/1999 | He et al. |

FOREIGN PATENT DOCUMENTS

| FR | 3 067 516 A1 | 12/2018 |
| JP | 2014229665 A | 12/2014 |

OTHER PUBLICATIONS

Passi et al., "Anisotropic vapor HF etching of silicon dioxide for Si microstructure release," 2012, Microelectronic Engineering, 95 (2012) 83-89.

*Primary Examiner* — Syed I Gheyas
(74) *Attorney, Agent, or Firm* — SEED INTELLECTUAL PROPERTY LAW GROUP LLP

(57) ABSTRACT

A method for manufacturing an electronic device includes locally implanting ionic species into a first region of a silicon nitride layer and into a first region of an electrically insulating layer located under the first region of the silicon nitride layer. A second region of the silicon nitride layer and a region of the electrically insulating layer located under the second region of the silicon nitride layer are protected from the implantation. The electrically insulating layer is disposed between a semi-conducting substrate and the silicon nitride layer. At least one trench is formed extending into the semi-conducting substrate through the silicon nitride layer and the electrically insulating layer. The trench separates the first region from the second region of the electrically insulating layer. The electrically insulating layer is selectively (Continued)

etched, and the etch rate of the electrically insulating layer in the first region is greater than the etch rate in the second region.

14 Claims, 4 Drawing Sheets

(58) Field of Classification Search
CPC ....... H01L 21/823481; H01L 21/31155; H01L 21/76235; H01L 21/31111
See application file for complete search history.

METHOD FOR MANUFACTURING AN ELECTRONIC DEVICE

BACKGROUND

Technical Field

The present disclosure relates to the manufacture of an electronic device comprising semi-conducting regions separated by electrically insulating trenches.

DESCRIPTION OF THE RELATED ART

Manufacturing an electronic device from a structure comprising a semi-conducting substrate, an electrically insulating layer and a silicon nitride layer comprises etching steps for forming trenches delimiting different semi-conducting regions of the substrate. Said regions are to form transistors and/or other electronic components.

FIG. 1 thus illustrates a starting structure comprising a semi-conducting substrate 1, a silicon oxide layer 2 and a silicon nitride layer 3.

FIG. 2 illustrates the formation of a trench 4 through the silicon nitride layer 3, the silicon oxide layer 2 and part of the semi-conducting substrate 1.

Said trench 4 is to be filled with silicon oxide in order to electrically insulate the components formed in the different regions of the structure.

Before this step of filling the trench, it is sometimes useful to undercut part of the silicon oxide under the silicon nitride. This undercut is made by selectively etching the silicon oxide relative to the silicon nitride and to the semi-conductor material of the substrate, which results in removing the oxide in a direction substantially parallel to the main plane of the substrate, from the free end of the oxide. An area having such an undercut is surrounded in FIG. 3. Such an undercut is particularly useful to increase the free surface area of the semi-conductor material and to promote its oxidation during steps prior to filling the trench with silicon oxide, so as to compensate for the different oxidation rates depending on the crystallographic orientation of said material, which varies at the angle formed between the edge (substantially vertical in FIG. 3) of the trench and the edge (substantially horizontal in FIG. 3) of the interface between the substrate and the electrically insulating layer.

Some electronic devices comprise, on a same substrate, different electronic components, meeting different specifications. Such is especially the case of an embedded Non-Volatile Memory (eNVM), which comprises, on a same semi-conducting substrate, memory-type components and digital components, which operate with different voltages.

Insofar as the manufacturing method is implemented on the whole substrate, any treatment used applies to all the components. A treatment used to improve the performance of some components can thus result in degrading the performance of other components, which implies a compromise on the performance of the different components of the device.

For example, in the case of an embedded non-volatile memory, the memory-type components should have a thick oxide withstanding a High Voltage (HV); the abovementioned undercut is particularly advantageous to avoid localised thinning of the oxide which would decrease its voltage withstand. However, hydrofluoric acid, which is the etching solution usually used to selectively etch silicon oxide, is likely to degrade digital components, especially creating parasitic transistors which decrease performance of these components.

BRIEF SUMMARY

Therefore, there remains a need for treating in different ways different regions of the structure, while avoiding alignment problems caused by the use of masks.

To do so, one embodiment relates to a method for manufacturing an electronic device, comprising the following steps of:

(a) providing a semi-conducting substrate successively covered with an electrically insulating layer and a silicon nitride layer;

(b) locally implanting ionic species into a first region of the silicon nitride layer, with an energy adapted to implant part of said species into a first region of the electrically insulating layer located under the first region of the silicon nitride layer, at least one second region of the silicon nitride layer and a region of the electrically insulating layer located under the second region of the silicon nitride layer being protected from said implantation;

(c) etching at least one trench into part of the semi-conducting substrate through the silicon nitride layer and the electrically insulating layer, said trench separating the first region from the second region of the electrically insulating layer; and (d) selectively etching the electrically insulating layer, the etch rate of the material of the electrically insulating layer in the first region being greater than the etch rate in the second region.

This method enables the electrically insulating layer to be selectively etched in a differential manner controlled by localising the implantation. Furthermore, implantation parameters enable the difference in the etch rate to be controlled between a region protected against implantation and a region that has undergone the implantation, in a ratio in the order of 1 to 20.

By "selective", it is meant in the present document a treatment which occurs at different rates for different materials exposed to said treatment.

By "differential", it is meant in the present document a treatment which occurs at different rates for a same material located in different regions of a same structure.

In some optional and possibly combined embodiments:
  the implanted species can comprise nitrogen, argon and/or phosphorus;
  etching can be performed by a solution comprising hydrofluoric acid (HF);
  after step (d), the method can comprise a step of undercutting the silicon nitride layer;
  at least one first component in a region of the semi-conducting substrate located under the first region of the electrically insulating layer and at least one second component in a region of the semi-conducting substrate located under the second region of the electrically insulating layer can be formed; and
  which first component can be a volatile memory component or a high voltage CMOS component and the second component can be a digital component or a low voltage CMOS component.

Another aspect relates to a structure likely to be obtained during the above-described method.

Said structure successively comprises a semi-conducting substrate, an electrically insulating layer and a silicon nitride layer, and at least one trench extending in part of the semi-conducting substrate through the silicon nitride layer and the electrically insulating layer, said trench separating a first region from a second region of the electrically insulating layer, wherein the first region of the electrically insulating layer has a larger lateral undercut relative to a region overlying the silicon nitride layer than that of the second region.

In some optional and possibly combined embodiments:
the lateral undercut of the first region of the electrically insulating layer can be between 2 and 20 times as large as that of the second region;
a region of the semi-conducting substrate located under the first region of the electrically insulating layer is adapted to form at least one first electronic component and a region of the semi-conducting substrate located under the second region of the electrically insulating layer is adapted to form at least one second electronic component;
the first component can be a volatile memory component or a high voltage CMOS component and the second component can be a digital component or a low voltage CMOS component;
the interface between the semi-conducting substrate and the first region of the electrically insulating layer can have a peripheral bowl shape; and
the first region of the electrically insulating layer has a concentration of implanted species greater than or equal to $10^{14}$ at/cm$^2$ and the second region has a concentration of implanted species lower than or equal to $10^{11}$ at/cm$^2$.

BRIEF DESCRIPTION OF THE SEVERAL VIEWS OF THE DRAWINGS

Further characteristics and advantages of these embodiments will appear in the detailed description that follows, with reference to the appended drawings in which.

For the sake of clarity of the figures, the drawings are not drawn to scale. Moreover, the drawings were simplified so as to show only elements useful for understanding the figures.

DETAILED DESCRIPTION

Selectively differentially etching the electrically insulating layer located under the silicon nitride layer is made possible by controlling etch rate of the material of said electrically insulating layer, so as to provide a higher etch rate in a region than in another. This control of the etch rate is related to a localised implantation of ionic species into the silicon nitride layer but also in the electrically insulating layer. By controlling the implantation energy within the scope of the art, the implantation peak in the depth of the silicon nitride layer and the electrically insulating layer is positioned such that a significant amount of implanted species is present in the silicon nitride layer and in the electrically insulating layer.

By localised implantation, it is meant that the ionic species are implanted into a first region of the silicon nitride layer (and into a first region of the electrically insulating layer located under the first region of the silicon nitride layer) but not into a second region of the silicon nitride layer adjacent to the first region (nor into a second region of the electrically insulating layer located under the second region of the silicon nitride layer and adjacent to the first region of the silicon nitride layer).

To this end, the second region of the silicon nitride layer is protected during the implantation of ionic species. Such a protection can be especially provided by a mask the material and the thickness of which are chosen to form a barrier to ionic species. The person skilled in the art is able to apply a lithography mask adapted to make localised implantation of ionic species.

The implanted ionic species are advantageously neutral or non-contaminating species in regard to the method implementation conditions.

Preferably, the ionic species can be chosen from argon, nitrogen and phosphorus.

It could be demonstrated that implanting said ionic species into a silicon oxide layer had the effect of increasing the etch rate of silicon oxide by hydrofluoric acid (HF).

Figure 1:
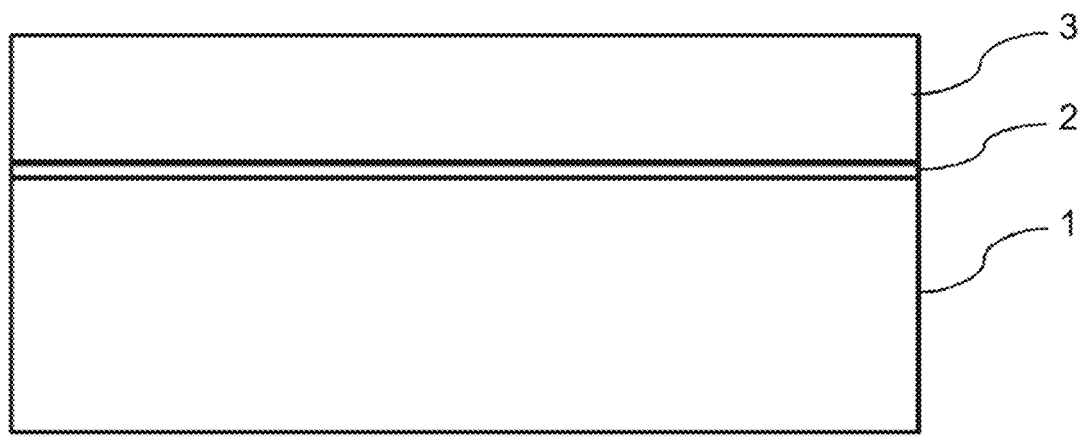
FIG. 1 is a schematic cross-section view of a semi-conducting substrate covered with an electrically insulating layer and with a silicon nitride layer, forming a starting structure for manufacturing an electronic device.
Figure 2:
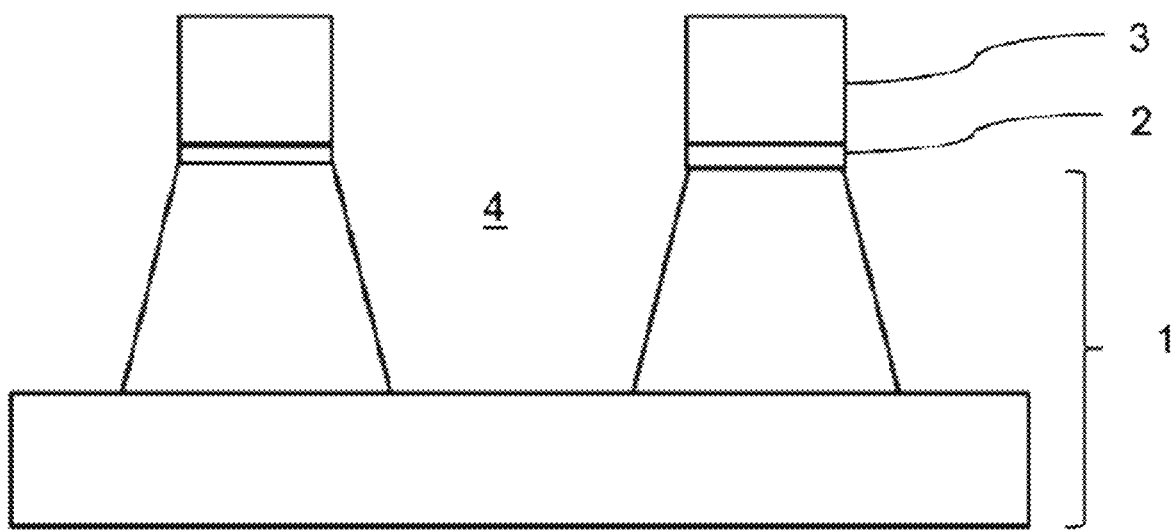
FIG. 2 is a schematic cross-section view of the structure of FIG. 1 after etching trenches extending through the silicon nitride layer and the electrically insulating layer into the semi-conducting substrate.
Figure 3:
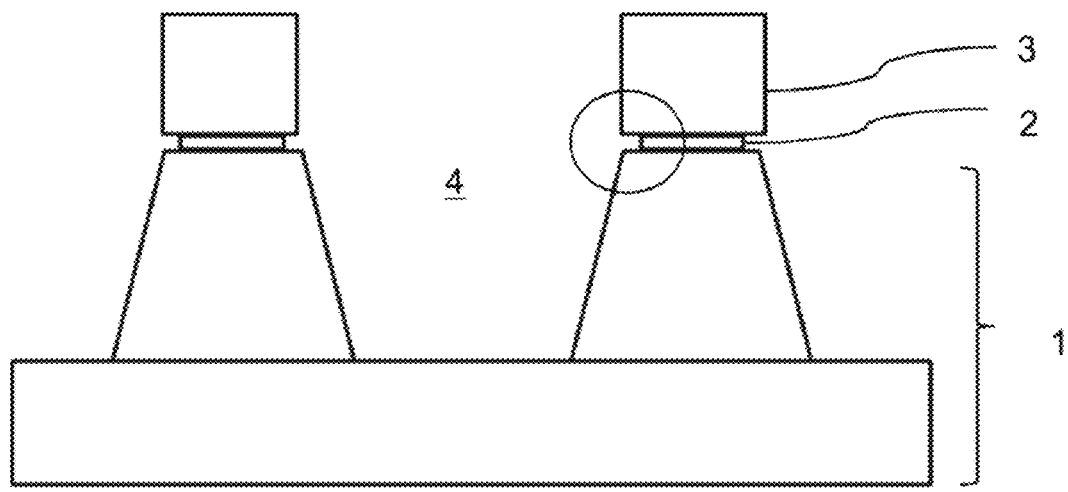
FIG. 3 is a schematic cross-section view of the structure of FIG. 2 after selectively etching the electrically insulating layer.
Figure 4:
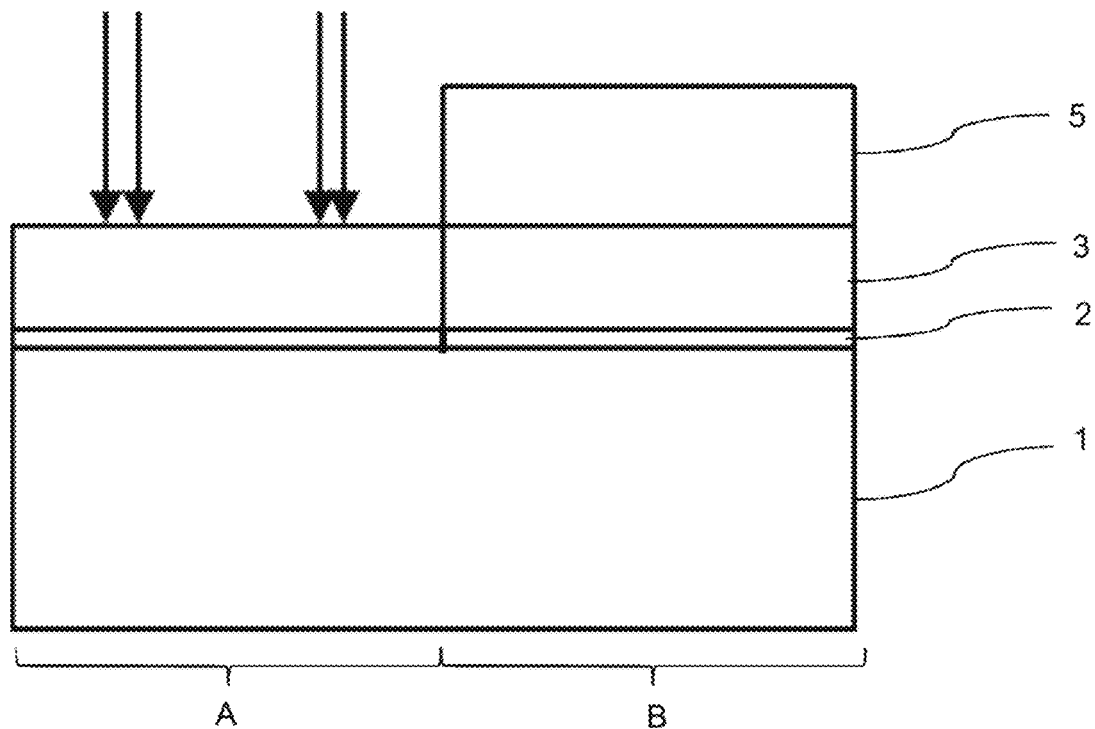
FIG. 4 is a schematic cross-section view of the structure of FIG. 1 during the implementation of a localised implantation of ionic species into a region of the silicon nitride layer and the electrically insulating layer.
Figure 5:
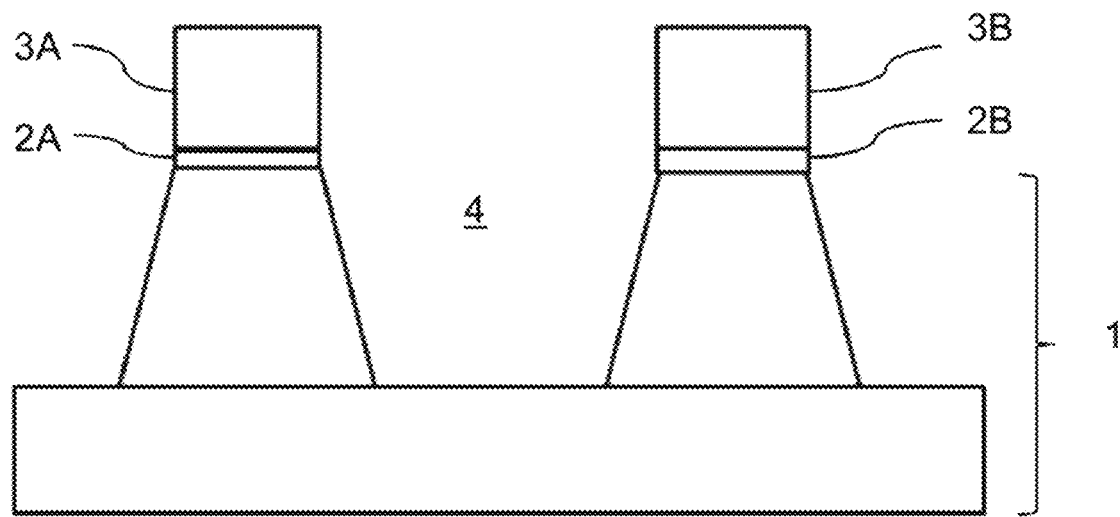
FIG. 5 is a schematic cross-section view of the structure of FIG. 4 after etching trenches extending through the silicon nitride layer and the electrically insulating layer into the semi-conducting substrate.
Figure 6:
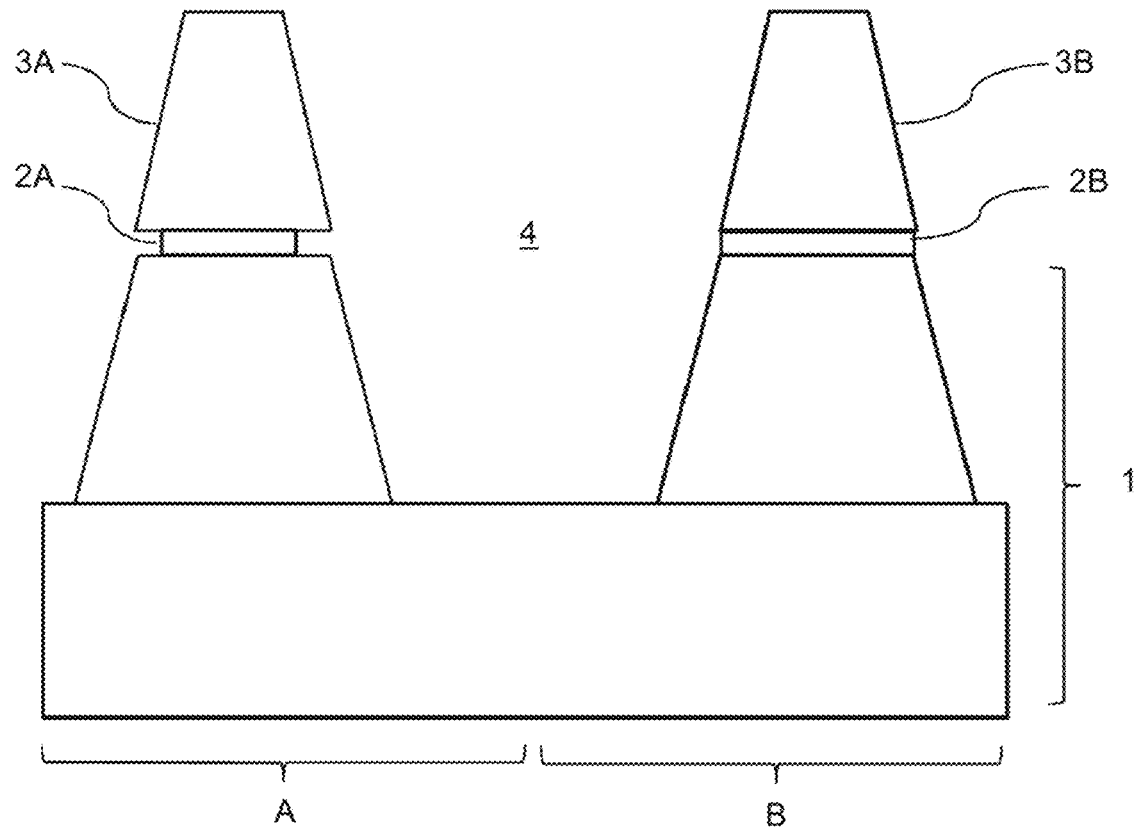
FIG. 6 is a schematic cross-section view of the structure of FIG. 5 after selectively etching the electrically insulating layer.

FIGS. 4 to 6 illustrate the main steps of a method for manufacturing an electronic device comprising selectively differentially etching the electrically insulating layer located under the silicon nitride layer.

With reference to FIG. 4, a starting structure comprising a semi-conducting substrate 1 successively covered with an electrically insulating layer 2 and with a silicon nitride layer 3 is provided. In the following of the description, it is considered that the electrically insulating layer is made of silicon oxide ($SiO_2$), but the method is also applicable to other electrically insulating materials, such as especially SiON, HfSiON, $ZrO_2$, $TiO_2$, $TaO_2$ (non-exhaustive list).

A mask 5 has been formed on the surface of the silicon nitride layer 3 according to a determined pattern. Said pattern defines in the mask openings leaving a first region of the surface of the silicon nitride layer 3 exposed, whereas a second region of said surface is covered with the mask 5. Said mask can for example be formed by depositing a photoresist which is removed facing the first region of the surface of the silicon nitride layer.

An implantation of ionic species (represented by the arrows) has been implemented in the starting structure through the mask openings.

Due to the presence of the mask, the ionic species have been selectively implanted into a first region 3A of the silicon nitride layer the surface of which is exposed through an opening of the mask, whereas a second region 3B of the silicon nitride layer the surface of which is covered with the mask has not undergone said implantation.

As previously indicated, the implantation energy is adapted to implant part of said species into a first region 2A of the silicon oxide layer located under the first region 3A of the silicon nitride layer. On the other hand, the region 2B of the silicon oxide layer located under the second region 3B of the silicon nitride layer does not undergo the implantation.

According to one embodiment, the thickness of the silicon nitride layer 3 is between 100 and 200 nm and the thickness of the silicon oxide layer 2 is between 1 and 25 nm.

In the structure a region A has thus been defined in which the ionic species were implanted into the silicon nitride and silicon oxide, and a region B in which the ionic species have not been implanted into the silicon nitride and silicon oxide. Due to this localised implantation, the crystal structure of the silicon nitride and of the silicon oxide of the region A has been modified relative to that of the silicon nitride and the silicon oxide of the region B.

After implantation, the mask 5 has been removed by any suitable technique.

With reference to FIG. 5, at least one trench 4 has been etched in the structure thus obtained. The trench 4 extends in part of the semi-conducting substrate 1, through the silicon nitride layer 3 and the electrically insulating layer 2.

Etching the trench can be implemented by means of phosphoric acid ($H_3PO_4$) and hydrofluoric acid.

Said trench 4 is arranged so as to separate the first region 2A from the second region 2B of the silicon oxide layer.

Possibly, although less preferred, the trench could have been formed before implantation.

With reference to FIG. 6, selective etching of silicon oxide relative to silicon nitride has been implemented.

Such an etching can be implemented by means of a hydrofluoric acid solution applied to the whole structure.

Due to the difference in the etch rate of the silicon oxide between region 2A and region 2B (said rate being higher in region 2A than in region 2B), the undercut of silicon oxide under the silicon nitride is greater in region A than in region B.

The increase in the etch rate of silicon oxide in region A enables the etch duration necessary to obtain the desired undercut to be reduced. This reduction in the etch duration is beneficial and prevents the performance of the components formed in region B from being affected.

In addition, as shown in FIG. 6, the silicon nitride layer 3A, which contains a different content in implanted species between the top and the bottom of the layer, may have been etched is such a way as to present a tapered shape, the lateral walls not being vertical but inclined so that the top of the layer 3A is narrower than the bottom of said layer. This tapered shape is advantageous in view of the subsequent filling of the trench with an electrically insulating material, since this shape promotes a complete filling of the trench and prevents the formation of voids within the electrically insulating material, which may generate defectivity in the final device. As an indication, the slope may be of the order of 60 to 80%.

The use of an implantation into silicon nitride has been described in document FR 3 067 516 to differentially etch silicon nitride above two regions of the substrate with opposite doping. In this method, the purpose was to etch not the silicon oxide but the silicon nitride in order to form, after filling silicon oxide into a trench separating said regions, a silicon oxide ring above the periphery of only one of said regions. In this respect, it will be noted that, as indicated above, the silicon nitride layer is much thicker than the one of silicon oxide and that the silicon nitride volume to be removed in the process of document FR 3 067 516 is much greater than the silicon oxide volume to be removed in the method described in the present text.

Document JP 2014-229665 discloses a different method for forming an undercut in a silicon oxide layer located under a silicon nitride layer. This method is implemented after forming a trench separating first and second active regions. The second active region is protected by a mask while the silicon oxide layer of the first active region is etched to create a first undercut. Then the protective layer is removed and the silicon oxide layer of both active regions is etched; as a result, the undercut of the first active region is greater than the undercut of the second active region. However, depositing a mask on a non-planar active region and subsequently removing this mask raises several problems on a manufacturing point of view. In particular, especially if the trench is narrow, it may be difficult to deposit the mask on the whole surface to be protected; it may also not be possible to ensure that the mask is fully removed, thereby generating a significant defectivity in the final device. In addition, with this method, the walls of the silicon nitride layer remain vertical, which may not allow preventing the formation of voids in the subsequent filling of the trench with an electrically insulating material.

By contrast, in the method described in the present disclosure, the deposition of the mask may be advantageously done before forming the trench, on the planar surface of the silicon nitride layer, which avoids the above-mentioned problems.

The following of the method (not illustrated) comprises filling silicon oxide into the trench 4 and then steps of manufacturing components in the regions A and B of the structure.

The components formed in regions A and B can belong to a same family of components; in this case, the undercut difference under the silicon nitride can enable different voltages to be applied to these components, the component formed in region A can withstand a higher voltage than that of region B. For example, the component formed in region A can be a high voltage CMOS component (HV CMOS) and the component formed in region B a low voltage CMOS component (LV CMOS).

Alternatively and particularly advantageously, the components formed in regions A and B belong to different families of components, especially families the components of which operate with different voltages. In this case, the greater undercut of silicon oxide in region A makes this region particularly adapted to form components operating with a high voltage. Advantageously components operating with a higher voltage in region A than in region B will therefore be formed.

For example, the component formed in region A can be a non-volatile memory component, an analog component, or a radiofrequency component, whereas the component formed in region B can be a digital component, a SRAM component, or an ROM memory component (non-exhaustive lists).

Possibly, a third region can be formed in the substrate with implantation of another dose of ionic species into the oxide layer, in order to provide an oxide undercut under the silicon nitride different from the one of regions A and B.

The method just described therefore particularly enables, in a same starting structure, a microcontroller to be formed, comprising components of different families the electric performance of which is optimised by controlling undercut of silicon oxide under the silicon nitride.

Figure 7:
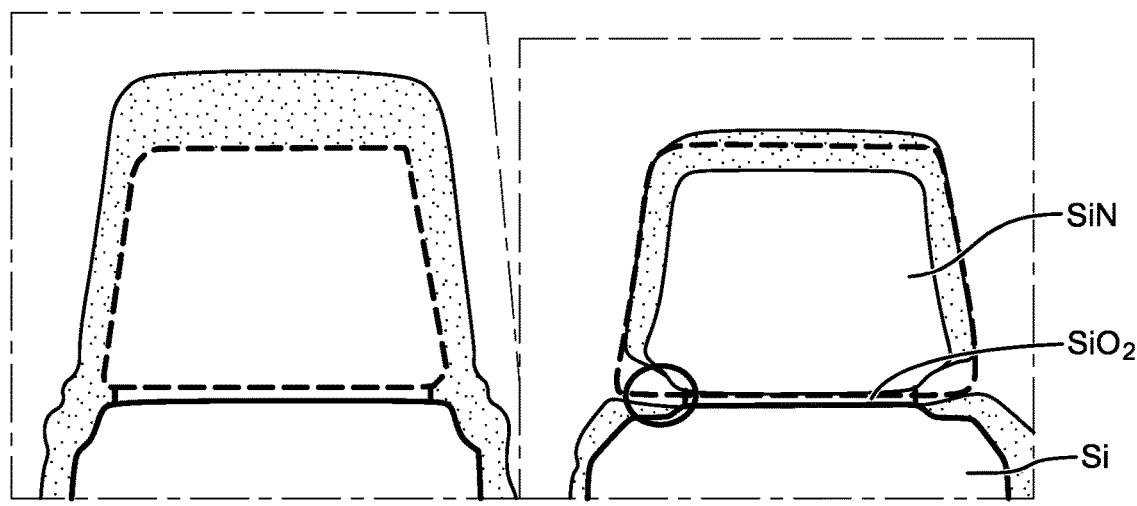
FIG. 7 shows cross-section views under a transmission electron microscope, after etching with hydrofluoric acid and with phosphoric acid, a region of the silicon nitride layer and a silicon oxide layer that has previously undergone an argon ion implantation (on the right) and similar regions that has not undergone this implantation.

FIG. 7 shows cross-section views under transmission electron microscope, after etching with hydrofluoric acid and phosphoric acid, a region of the silicon nitride layer and of a silicon oxide layer that has previously undergone an argon ion implantation (on the right) and similar regions that have not undergone this implantation (on the left).

The outline in dotted lines is identical on both images, in order to facilitate comparison between shapes and dimensions of regions etched in both structures, the etch duration being identical in both structures.

It is observed that in the structure submitted to the implantation, the silicon nitride and silicon oxide have been etched more significantly than in the structure that has not undergone the implantation. Particularly, the lower corners of the silicon nitride layer (one of which is surrounded by a circle) have been etched more significantly, thus forming an opening at the interface between the silicon nitride layer and the silicon oxide layer exposing a larger surface area of the silicon oxide underlying the etching solution.

Combining a greater exposed surface area and a higher etch rate for the silicon oxide layer makes it possible to obtain, for a shorter duration, a significant undercut of the silicon oxide under the silicon nitride. During a subsequent oxidation, the gate oxide layer formed on silicon has a better conformity and consequently a better breakdown withstand.

The opening at the bottom of the silicon nitride layer may be particularly advantageous since the silicon oxide layer may be very thin (a few nanometers thick) and that it may thus be difficult to localize the implanted atomic species only in said layer. Implanting atomic species also in the bottom of the silicon nitride layer allows modifying the shape of said layer at the interface with the silicon oxide layer to increase exposure of the silicon oxide layer to the etching agent.

Depending on the dose of implanted ionic species, an etch rate of the silicon oxide in region A up to 20 times higher than in region B can be achieved. Thus, the lateral undercut of the silicon oxide in region A can be adjusted so that it is 2 to 20 times higher than in region B.

Purely by way of indicating and in no way limiting purposes, a dose of ionic species greater than or equal to $10^{14}$ at/cm$^2$, for example in the order of $10^{15}$ at/cm$^2$, is adapted to implement the method. Since silicon oxide in region B has not undergone the implantation or is unintentionally doped, its concentration of ionic species is typically lower than or equal to $10^{11}$ at/cm$^2$.

Figure 8:
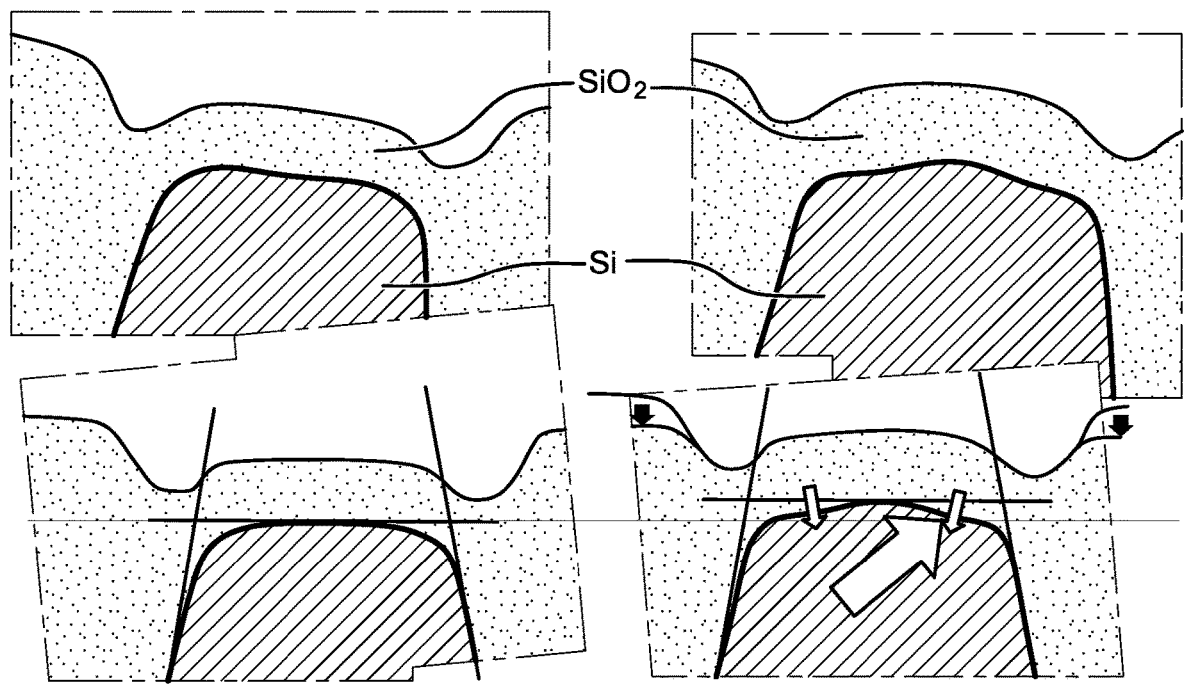
FIG. 8 shows cross-section views under a transmission electron microscope of two transistors of a same substrate having a differential selective etching of the silicon oxide layer.

FIG. 8 shows cross-section views under transmission electron microscope of two transistors of a same substrate having a differential selective etching of the silicon oxide layer. In these images, the dark block is a region of silicon and the light zone directly surrounding this dark block is a region of silicon oxide.

The image on the left corresponds to a transistor formed in a region not subjected to the implantation, that on the right corresponds to a transistor formed in a region that has undergone the above-described implantation. The silicon/silicon oxide interface is different between both transistors. In the transistor on the right, a hollowing of the silicon surface in the vicinity of the edges is observed, resulting in an interface profile having a bump in the centre of the region of silicon, whereas the corresponding interface in the transistor on the left is substantially planar. This specific shape of the interface, comparable to a peripheral bowl, is due to a more significant oxide etching before forming the gate oxide.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate having a first surface, the substrate including:
   a first extension of the substrate that extends away from the first surface, sidewalls of the first extension are tapered, the first extension having a second surface;
   a first portion of an insulating layer on the second surface of the first extension, wherein the first portion of the insulating layer includes an undercut;
   a first portion of a silicon nitride layer on the first portion of the insulating layer, sidewalls of the first portion of the silicon nitride layer are tapered.

2. The device of claim 1 wherein the first portion of the insulating layer includes sidewalls that are closer to a central region than sidewalls of the first portion of the silicon nitride layer.

3. The device of claim 1, comprising:
   a second extension of the substrate that extends away from the first surface, the second extension having a third surface, the second extension being spaced from the first extension;
   a second portion of the insulating layer on the third surface of the second extension.

4. The device of claim 3, comprising a second portion of the silicon nitride layer on the second portion of the insulating layer, sidewalls of the second portion of the silicon nitride layer are tapered.

5. The device of claim 4 wherein the sidewalls of the second extension are tapered.

6. A device, comprising:
   a substrate having a first surface, the substrate including:
   a first extension of the substrate that extends away from the first surface, the first extension having a second surface, wherein sidewalls of the first extension are tapered;
   a first portion of an insulating layer on the second surface of the first extension, wherein the first portion of the insulating layer includes an undercut;
   a first portion of a silicon nitride layer on the first portion of the insulating layer, sidewalls of the first portion of the silicon nitride layer are tapered.

7. The device of claim 6 wherein the first portion of the insulating layer includes sidewalls that are closer to a central region than sidewalls of the first portion of the silicon nitride layer.

8. The device of claim 6, comprising:
   a second extension of the substrate that extends away from the first surface, the second extension having a third surface, the second extension being spaced from the first extension;

a second portion of the insulating layer on the third surface of the second extension.

9. The device of claim 8, comprising a second portion of the silicon nitride layer on the second portion of the insulating layer, sidewalls of the second portion of the silicon nitride layer are tapered.

10. The device of claim 9 wherein the sidewalls of the second extension are tapered.

11. A method, comprising:
forming a first extension of a substrate that extends away from a first surface of the substrate, the first extension having a second surface, wherein forming the first extension includes forming tapered sidewalls of the first extension;
forming a first portion of an insulating layer on the second surface of the first extension, wherein forming the first portion of the insulating layer to have an undercut;
forming a first portion of a silicon nitride layer on the first portion of the insulating layer, sidewalls of the first portion of the silicon nitride layer are tapered.

12. The method of claim 11, comprising:
forming a second extension of the substrate that extends away from the first surface, the second extension having a third surface, the second extension being spaced from the first extension; and
forming a second portion of the insulating layer on the third surface of the second extension.

13. The method of claim 12, comprising forming a second portion of the silicon nitride layer on the second portion of the insulating layer, sidewalls of the second portion of the silicon nitride layer are tapered.

14. The method of claim 13 wherein the sidewalls of the second extension are tapered.

* * * * *